（12) United States Patent
Byun

(10) Patent No.: US 10,872,917 B2
(45) Date of Patent: Dec. 22, 2020

(54) IMAGE SENSOR HAVING PHASE DIFFERENCE DETECTION PIXEL

(71) Applicant: SK hynix Inc., Icheon-si (KR)

(72) Inventor: Kyung-Su Byun, Gwangju-si (KR)

(73) Assignee: SK hynix Inc., Icheon-si (KR)

( * ) Notice: Subject to any disclaimer, the term of this patent is extended or adjusted under 35 U.S.C. 154(b) by 44 days.

(21) Appl. No.: 15/914,530

(22) Filed: Mar. 7, 2018

(65) Prior Publication Data

US 2019/0035839 A1    Jan. 31, 2019

(30) Foreign Application Priority Data

Jul. 28, 2017 (KR) .................. 10-2017-0096366

(51) Int. Cl.
| | |
|---|---|
| *H01L 27/146* | (2006.01) |
| *H04N 5/232* | (2006.01) |
| *H04N 5/369* | (2011.01) |
| *H01L 27/30* | (2006.01) |

(52) U.S. Cl.
CPC .... *H01L 27/14623* (2013.01); *H01L 27/1463* (2013.01); *H01L 27/14607* (2013.01); *H01L 27/14645* (2013.01); *H01L 27/14621* (2013.01); *H01L 27/14627* (2013.01); *H01L 27/307* (2013.01); *H04N 5/23212* (2013.01); *H04N 5/232122* (2018.08); *H04N 5/3696* (2013.01)

(58) Field of Classification Search
CPC .. H04N 5/369; H04N 5/3696; H04N 5/36961; H04N 5/232122; H04N 5/23212; H01L 27/146; H01L 27/14623; H01L 27/14601; H01L 27/1463; H01L 27/14603; H01L 27/14607; H01L 27/14645
See application file for complete search history.

(56) References Cited

U.S. PATENT DOCUMENTS

| | | | |
|---|---|---|---|
| 8,704,942 B2* | 4/2014 | Shimoda | H04N 5/23212 348/280 |
| 9,524,999 B2 | 12/2016 | Nomura | |
| 9,911,768 B2* | 3/2018 | Nakamura | H04N 5/369 |
| 10,014,338 B2* | 7/2018 | Lee | H01L 27/14621 |
| 2012/0242874 A1 | 9/2012 | Noudo | |
| 2016/0043119 A1 | 2/2016 | Lee et al. | |
| 2019/0174033 A1* | 6/2019 | Masuda | H01L 27/14629 |
| 2019/0222786 A1* | 7/2019 | Kobayashi | H01L 27/146 |

\* cited by examiner

*Primary Examiner* — Ahmed A Berhan
(74) *Attorney, Agent, or Firm* — Perkins Coie LLP

(57) ABSTRACT

An image sensor may include: a substrate including a plurality of pixels including a first pixel and a second pixel that are located adjacent to each other in a first direction, the first pixel including a first photoelectric conversion element and an open part which is eccentrically located in the first pixel in the first direction and the second pixel including a second photoelectric conversion element; a light-shield pattern that is formed over a part of the first photoelectric conversion element of the first pixel; and a light blocking layer formed between the first photoelectric conversion element and the second photoelectric conversion element.

14 Claims, 10 Drawing Sheets

IMAGE SENSOR HAVING PHASE DIFFERENCE DETECTION PIXEL

CROSS-REFERENCE TO RELATED APPLICATION

This patent document claims the priority and benefits of Korean Patent Application No. 10-2017-0096366 filed on Jul. 28, 2017 in the Korean Intellectual Property Office, the disclosure of which is incorporated herein by reference in its entirety.

TECHNICAL FIELD

The technology and implementations disclosed in this patent document relate to semiconductor image sensors.

BACKGROUND

An image sensor is a device which receives light from an optical image or one or more objects and converts the received light into electrical signals forming an image. Recently, with the development of the computer industry and communication industry, the demand for an image sensor having improved performance is increasing in various fields or applications, including, e.g., a digital camera, a camcorder, a portable device such as a personal communication system, a game machine, a security camera, a medical micro-camera and a robot.

SUMMARY

Various embodiments are directed to provide an image sensor having improved performance.

In an embodiment, an image sensor may include: a substrate including a plurality of pixels including a first pixel and a second pixel that are located adjacent to each other in a first direction, the first pixel including a first photoelectric conversion element and an open part which is eccentrically located in the first pixel in the first direction and the second pixel including a second photoelectric conversion element; a light-shield pattern that is formed over a part of the first photoelectric conversion element of the first pixel; and a light blocking layer formed between the first photoelectric conversion element and the second photoelectric conversion element.

The image sensor may further include: a grid pattern formed over the substrate along boundaries of the pixels, wherein the light-shield pattern may be formed in a same level as the grid pattern and abuts on the grid pattern. The light blocking layer abuts on a surface of the substrate over which the grid pattern is formed.

The light blocking layer may be formed in a trench formed in the substrate. The light blocking layer extends along third and fourth directions that cross the first direction and opposite to each other and has ends located between pixels adjacent to the first pixel and the second pixel. The first and second photoelectric conversion elements are electrically isolated from each other by an impurity region formed in the substrate.

The light blocking layer may have a bar shape having a major axis extending in a third direction crossing the first direction, and a minor axis. The open part may have a bar shape having a major axis and a minor axis, wherein the major axis of the open part extends in the third direction, and wherein a length of the major axis of the light blocking layer is greater than a length of the major axis of the open part.

The light blocking layer may include a first region and a second region, each of the first region and the second region has a bar shape having a major axis and a minor axis, wherein the major axis of the first region extends in a third direction crossing the first direction, and wherein the major axis of the second region extends in a second direction opposite to the first direction. The open part may have a bar shape having a major axis and a minor axis, and the major axis of the open part extends in the third direction, and wherein a length of the major axis of the first region is greater than a length of the major axis of the open part, and a length of the major axis of the second region is greater than a length of the minor axis of the open part.

In an embodiment, an image sensor may include: a substrate including a plurality of pixels including a first pixel having an open part which is eccentrically located in the first pixel in a first direction, a second pixel located adjacent to the first pixel in the first direction, and a third pixel located adjacent to the second pixel in the first direction, the first to third pixels including first to third photoelectric conversion elements, respectively; a light-shield pattern that is formed over a part of the first photoelectric conversion element of the first pixel; a first light blocking layer formed between the first photoelectric conversion element and the second photoelectric conversion element; and a second light blocking layer formed between the second photoelectric conversion element and the third photoelectric conversion element.

The image sensor may further include: a grid pattern formed over the substrate along boundaries of the pixels, wherein the light-shield pattern may be formed in a same level as the grid pattern and abuts on the grid pattern. The first light blocking layer and the second light blocking layer abuts on a surface of the substrate over which the grid pattern is formed.

Each of the first light blocking layer and the second light blocking layer may be formed in a trench formed in the substrate. The first light blocking layer extends along third and fourth directions that cross the first direction and opposite to each other and has ends located between pixels adjacent to the first pixel and the second pixel, and wherein the second light blocking layer extends along the third and fourth directions and has ends located between pixels adjacent to the second pixel and the third pixel. The first to third photoelectric conversion elements may be electrically isolated from one another by an impurity region formed in the substrate.

Each of the first light blocking layer and the second light blocking layer may have a bar shape having a major axis extending in a third direction crossing the first direction, and a minor axis. The open part may have a bar shape having a major axis and a minor axis, wherein the major axis of the open part extends in the third direction, and wherein a length of the major axis of the first light blocking layer and a length of the major axis of the second light blocking layer are greater than a length of the major axis of the open part.

The first light blocking layer may include a first region and a second region, each of the first region and the second region has a bar shape having a major axis and a minor axis, the major axis of the first region extends in a third direction crossing the first direction, and the major axis of the second region extends in a second direction opposite to the first direction, and wherein the second light blocking layer may have a bar shape having a major axis extending in a third direction crossing the first direction, and a minor axis. The open part may have a bar shape having a major axis and a minor axis, and the major axis of the open part extends in the third direction, and wherein a length of the major axis of the first region and a length of the major axis of the second light blocking layer are greater than a length of the major axis of the open part, and a length of the major axis of the second region is greater than a length of the minor axis of the open part.

In an embodiment, an image sensor may include: a substrate including a plurality of pixels including a first pixel having an open part which is eccentrically located in the first pixel in a first direction, a second pixel located adjacent to the first pixel in a first direction, and a third pixel located adjacent to the first pixel in a second direction opposite to the first direction, the first to third pixels including first to third photoelectric conversion elements, respectively; and a light-shield pattern that is formed over a part of the first photoelectric conversion element of the first pixel, and wherein the substrate includes a depressed region formed between the first photoelectric conversion element and the second photoelectric conversion element, and a non-depressed region formed between the first photoelectric conversion element and the third photoelectric conversion element.

The plurality of pixels may further include a fourth pixel located adjacent to the second pixel in the first direction and the fourth pixel including a fourth photoelectric conversion elements, and wherein the image sensor further comprises an additional depressed region formed between the second photoelectric conversion element and the fourth photoelectric conversion element.

The image sensor may further include a light blocking layer located in the depressed region. The light blocking layer may have a bar shape having a major axis extending in a third direction crossing the first direction, and a minor axis. The light blocking layer extends along third and fourth directions that cross the first direction and the second direction and opposite to each other and has ends located between pixels adjacent to the first pixel and the second pixel.

DETAILED DESCRIPTION

Figure 1:
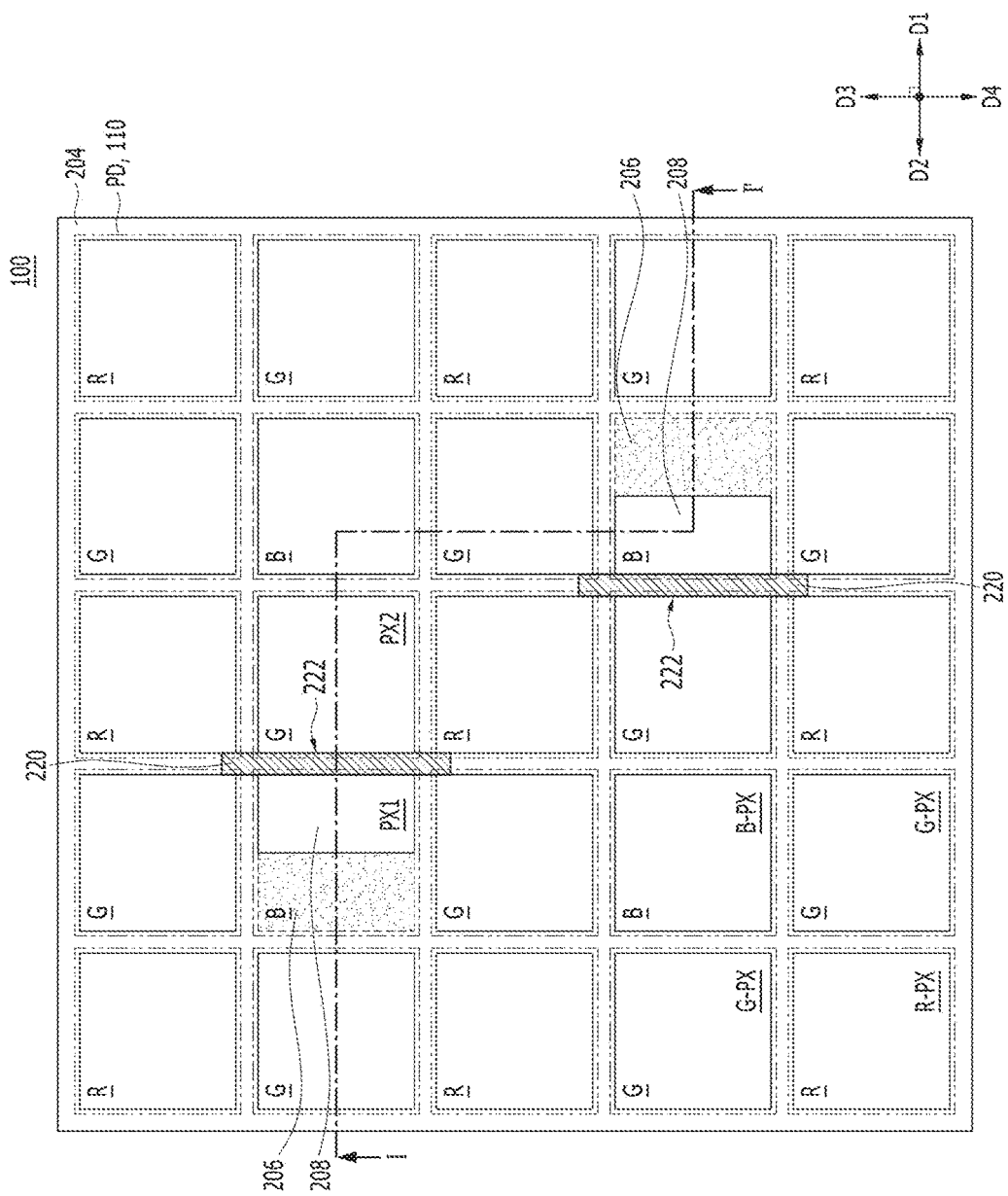
FIG. 1 and FIG. 2 are views illustrating an exemplary image sensor in accordance with a first embodiment of the present disclosure.

The disclosed image sensing technology can be implemented to provide an image sensor device to improve the imaging operation performance. In some implementations, an image sensor array is provided to include imaging pixels and phase difference detection pixels where the imaging pixels are designed and operated for capturing incident light to capture or represent a subject or a scene as a color image, and the phase difference detection pixels are designed and operated for capturing incident light at different phase difference detection pixels to detect a phase of a captured image or scene for implementing auto-focusing and representing a three-dimensional representation of the captured image or scene. In some implementations of phase difference detection pixels, two different phase detection pixels can be paired to obtain signals that can be processed to measure the distance difference or the phase of a detected image for automatic focusing or 3D image representation in optical imaging. Under this design, the imaging pixels and the phase difference detection pixels are spatially distributed in the same pixel array and, accordingly, due to the placement of the phase difference detection pixels amidst imaging pixels, in imaging construction of the entire pixel array, an interpolation process is performed to process or interpolate pixel signals from imaging pixels adjacent to a phase difference detection pixel to produce an interpolated imaging pixel signal value for the phase detection pixel. As a result, the pixel signals from imaging pixels and the interpolated imaging pixel signal values for phase difference detection pixels are combined to construct a captured image by the image sensor array.

The disclosed image sensor arrays can be based on various semiconductor sensor structures including, for example, a complementary metal oxide semiconductor (CMOS) image sensor or CIS. A CIS sensor can include an array of imaging pixels each including a photosensor that converts received light into electric charges, which may be a photogate, a photodiode, a phototransistor, a photoconductor, or a photosensitive structure capable of generating photo-generated charges. Each imaging pixel can also include a charge storage region for storing the photo-generated charges, which may be constructed as a floating diffusion region in some implementations. Additional circuitry may be included in each imaging pixel, e.g., a transfer transistor for transferring the photo-generated charges from the photosensor to the storage region and a reset circuitry for resetting the charges in the charge storage region after a readout.

In some implementations, the disclosed technology based on having both imaging pixels and phase difference detection pixels in the same sensor array can be used to reduce or prevent undesired leakage of some of the light received at one of the phase difference detection pixels. This undesired leakage of light between adjacent imaging and phase difference detection pixels is one form of optical crosstalk. The disclosed technology can be implemented to provide a method image sensors having both imaging pixels and phase difference detection pixels in a sensor array with pixel configurations and techniques for mitigating or preventing undesired optical crosstalk that occurs between an imaging pixel and a phase difference detection pixel in the disclosed image sensor.

Optical crosstalk that occurs between an imaging pixel and a phase difference detection pixel may cause a problem or an undesired effect such as degrading the characteristics of the image sensor. For example, optical crosstalk may cause the brightness of the imaging pixels in the image sensor to be non-uniform over the sensor array. For example, when optical cross talk occurs, imaging pixels adjacent to a phase difference detection pixel may appear brighter than other imaging pixels because incident light to the phase difference detection pixel may enter into the adjacent imaging pixels. In order to solve this problem and the prevent the degradation of the characteristics of the image sensor, a trench isolation structure may be provided to reduce this extra light received at certain imaging pixels located adjacent to a phase difference detection pixel based on, e.g., forming a trench isolation structure, for example, Shallow Trench Isolation (STI) or Deep Trench Isolation (DTI), across the whole area of a pixel array. However, using a trench isolation structure may be disadvantageous in that the process of forming a trench inevitably induces defects on the surface of the trench and the defects on the surface of the trench can act as the source of leakage current such as a dark current, which degrades the characteristics of the image sensor.

The disclosed technology provides a new approach to arranging and configuring an image sensor including a plurality of imaging pixels and a plurality of phase difference detection pixels to reduce or prevent optical crosstalk between adjacent imaging and phase difference detection pixels and thus the degradation of the characteristics of the image sensor. One embodiment of the present disclosure provides a method through which optical crosstalk occurring between an imaging pixel and a phase difference detection pixel can be mitigated or prevented by minimizing or limiting the use of a trench isolation structure. To this end, an image sensor in accordance with an embodiment of the disclosed technology may include a light blocking layer formed between a photoelectric conversion element of an imaging pixel and a phase difference detection pixel. The location of the light blocking layer may be determined in consideration of a light-receiving region of the phase difference detection pixel.

Figure 2:
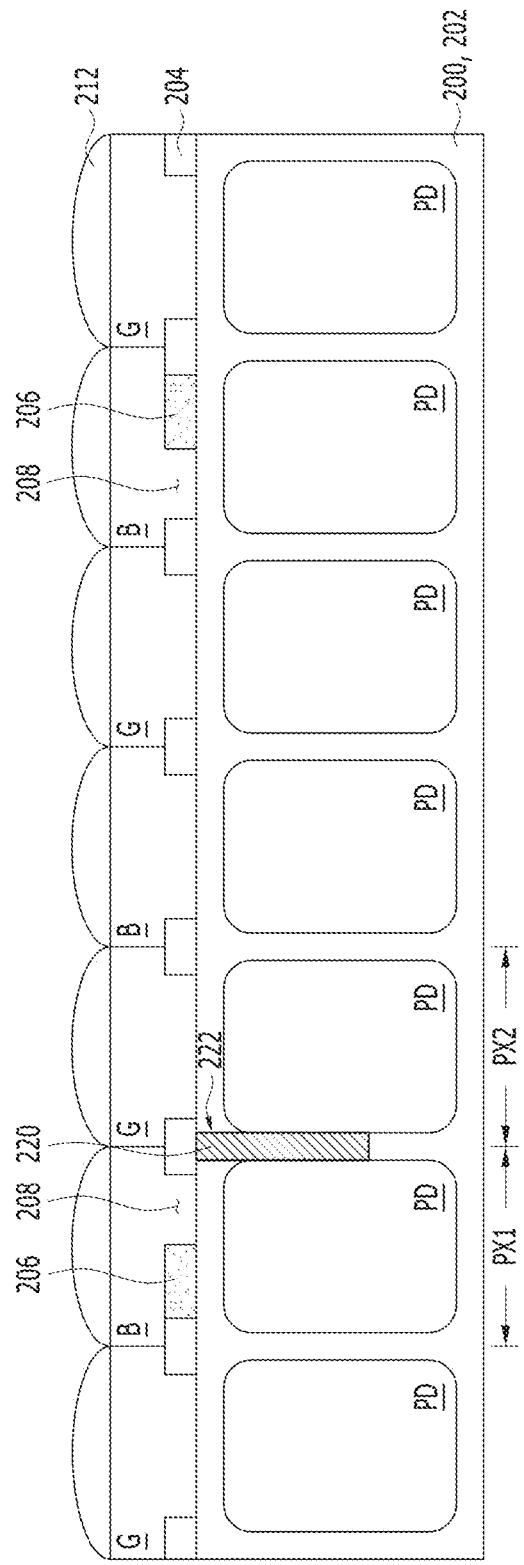

FIG. 1 and FIG. 2 are views illustrating an exemplary image sensor in accordance with a first embodiment of the present disclosure. Specifically, FIG. 1 is a plan view illustrating a part of a pixel array of the illustrated image sensor example, and FIG. 2 is a cross-sectional view of the pixel array illustrating a cross section formed by cutting along the dotted line I-I' shown in FIG. 1.

As illustrated in FIG. 1 and FIG. 2, the image sensor in accordance with the first embodiment may include a pixel array 100 in which a plurality of pixels 110 are arranged in a matrix form, e.g., an array of pixels arranged in columns and rows. The pixels 110 may include a plurality of imaging pixels and a plurality of phase difference detection pixels. Such imaging pixels and phase difference detection pixels may be interleaved in the pixel array 100. In some implementations, the phase difference detection pixels may be regularly or irregularly distributed in the pixel array 100.

In the pixel array 100, the imaging pixels may be arranged in a suitable color imaging pixel pattern for desired colors (e.g., red, green and blue) such that different colored imaging pixels are repeatedly arranged (e.g., colored pixels based on red pixels R-PX, green pixels G-PX, and blue pixels B-PX are repeatedly arranged). Such a color imaging pixel pattern may be, in some implementations, the Bayer pattern, for example. In the pixel array 100, the number of the phase difference detection pixels may be different from the number of the imaging pixels. In various implementations, the number of the phase difference detection pixels may be less than the number of the plurality of imaging pixels and such phase difference detection pixels are placed at certain locations within the pixel array 100 to perform desired phase detection for autofocusing or 3D imaging. In some implementations where there are more imaging pixels than the phase difference detection pixels, the imaging pixels may be arranged and interleaved with imaging pixels in the pixel array 100 such that one phase difference detection pixel may be surrounded or next to different imaging pixels. Conceptually, the arrangement of the phase difference detection pixels and imaging pixels in the pixel array 100 may be viewed by first having the pixel array 100 with all pixels occupied by imaging pixels and then selectively replacing some of the imaging pixels with phase difference detection pixels to form the final arrangement of the pixel array 100 with both imaging pixels and phase difference detection pixels.

In designing an image sensor for a particular application, the arrangement of imaging pixels and phase difference detection pixels in a pixel array 100 may be based on various considerations. For example, the locations of phase difference detection pixels in the pixel array 100 may be selected in consideration of imaging color qualities (e.g., undesired color shading in color reproduction by the image sensor) and/or fabrication of the semiconductor layers for forming the imaging pixels and the phase difference detection pixels. One example of the image color qualities is the undesired color shading in color reproduction in image sensors due to various factors, e.g., the presence of the imaging lens for directing incident light onto the imaging pixels, the non-uniform spectral responses of color filters over the pixel array 100, non-uniform spectral responses to light at different wavelengths by imaging pixels, or non-uniform pixel responses by imaging pixels. For example, in an imaging pixel arrangement with imaging pixels for respectively sensing red, blue and green colors in a Bayer pattern, the phase difference detection pixels may be placed at locations of certain blue pixels B-PX in the Bayer pattern. Specifically, each of the phase difference detection pixels may be placed at certain blue pixel locations and may include a blue filter B at such phase difference detection pixels. for the consideration for this particular design of using certain blue pixels B-PX in the pixel array 100 as the phase difference detection pixels is that characteristic degradation caused by color shading can be reduced or prevented and that this particular design can facilitate an interpolation process for generating interpolated imaging pixel signal values for the phase difference detection pixels. In this regard, a red pixel R-PX may be disadvantageous as a location for placing a phase difference detection pixel because such a red pixel R-PX has a color shading characteristic inferior to that of a blue pixel B-PX or a green pixel G-PX. Also, in the Bayer pattern, green pixels G-PX adjacent to a single green pixel G-PX are usually located in a diagonal direction relative to the single green pixel G-PX in the pixel array 100. Accordingly, the use of a green pixel G-PX as a phase difference detection pixel may be disadvantageous as pixel locations for placing phase difference detection pixels because it can be difficult to perform an interpolation process for generating interpolated imaging pixel signal values for the phase difference detection pixels.

The first embodiment describes an example in which the imaging pixels are arranged in the Bayer pattern, but the present disclosure is not limited to imaging pixels in the Bayer pattern and can be applied to other imaging pixel pattern arrangements. Although not illustrated in the drawing, in a different implementation example, an image sensor array may include white color sensing pixels each capable of sensing light at different wavelengths, e.g., wavelengths in at least a visible light spectrum and phase difference detection pixels may be configured to be placed at certain white pixel locations (not illustrated), instead of using locations of certain blue pixels B-PX for placing the phase difference detection pixels in the previous implementation example. In this example that uses certain white pixel locations for placing the phase difference detection pixels, the phase difference detection pixels may not have color filters. More specifically in this example, the region above such a phase difference detection pixel in which a color filter which would be present in an imaging pixel but is absent, is filled with a layer made of a material that is the same as that of a light-collecting element 212.

In yet another implementation example, the imaging pixels may be formed to include red pixels R-PX, green pixels G-PX, blue pixels B-PX, and white pixels that are repeatedly arranged across the imaging pixels. In this case, the phase difference detection pixels may be placed at certain locations for the white pixels.

In the image sensor in accordance with the first embodiment, each of the pixels 110 may include a photoelectric conversion element PD (e.g., a photodiode or a photogate). Photoelectric conversion elements PDs adjacent to each other may be isolated by a device isolation structure. In the illustrated example, the photoelectric conversion element PD and the device isolation structure may be formed in a substrate 200.

The substrate 200 may include a semiconductor substrate. The semiconductor substrate may be a suitable material state, e.g., in a single crystal state, and may include a material containing silicon. Also, the substrate 200 may be a substrate thinned through a thinning process. For example, the substrate 200 may be or include a thin silicon single-crystal substrate.

The photoelectric conversion element PD that is formed in the substrate 200 so as to correspond to each of the pixels 110 may include at least one of a photodiode, a phototransistor, a photogate, or a combination thereof. For example, the photoelectric conversion element PD may include a photodiode. In some implementations, the photoelectric conversion element PD may comprise any one of an organic photodiode or an inorganic photodiode, or may be configured such that an organic photodiode and an inorganic photodiode are laminated.

The device isolation structure for isolating photoelectric conversion elements PD that are adjacent to each other may include an impurity region 202. Specifically, the device isolation structure may include a well that is formed in the substrate 200 so as to correspond to the pixel array 100. The conductivity type of the well may be P-type, and the photoelectric conversion element PD may be formed inside the well. Accordingly, the photoelectric conversion elements may be electrically isolated by the impurity region 202. In some implementations, a trench isolation structure, such as Shallow Trench Isolation (STI) or Deep Trench Isolation (DTI), may be used as the device isolation structure. The trench isolation structure may induce defects on the surface of the trench in the process of forming a trench in the substrate 200, and the defects formed on the surface of the trench may act as the source of a dark current, which degrades the characteristics of the image sensor. The characteristic degradation attributable to the trench isolation structure may be fundamentally prevented or reduced by using the device isolation structure with the impurity region 202 as illustrated in the example in FIG. 2 in which the impurity region 202 is formed across the entire substrate 200.

Referring to FIG. 2, the image sensor in accordance with the first embodiment may include a grid pattern 204 formed over the substrate 200 along the boundaries of the pixels 110, a plurality of color filters for a red color (R), a green color (G), and a blue color (B) formed over the substrate 200 so as to correspond to the pixels 110, and light-collecting elements 212 formed over the color filters R, G, and B so as to respectively correspond to the pixels 110.

The grid pattern 204 operates to provide an optical isolation between pixels 110 that are adjacent to each other and preventing optical crosstalk. The grid pattern 204 may be formed over the surface of the substrate 200 corresponding to a light-receiving face or the light-incidence face of the photoelectric conversion element PD. In this example, the grid pattern 204 is intentionally located close to the photoelectric conversion element PD in order to more effectively reduce or prevent undesired optical crosstalk. Because the grid pattern 204 is formed along the boundaries of the pixels 110, the planar shape thereof may be configured as a mesh shape with openings that are repetitively arranged in a plane. The grid pattern 204 may have a uniform thickness and line width regardless of the position thereof. Accordingly, the sizes or areas of openings respectively provided to the pixels 110 by the grid pattern 204 may be equal to each other. In this specific design, the areas of light-receiving regions respectively provided to the pixels 110 by the grid pattern 204 may be equal to each other. The grid pattern 204 may include light-shielding material that may include a light-reflecting or light-absorbing material. The light-shielding material may include a material that reflects or absorbs light to shield light from the region below, and may include, in some implementations, a material that contains a metallic substance. A light-absorbing material for the light-shielding material may include a material that absorbs light, and may include silicon carbide (SiC), black-colored organic material, or others.

The color filters R, G, and B are formed over the substrate 200 so as to correspond to the pixels 110, and the edge of each of the color filters R, G, and B may be formed over the grid pattern 204. The grid pattern 204 may be located between the substrate 200 and the color pixels R, G, and B. The color filters R, G, and B may have the same size as one another, and each of the color filters R, G, and B may be wider than the area of an opening provided by the grid pattern 204. Each of the color filters R, G, and B may include a single-layer filter or multi-layer filter that is configured to include any one or at least two of a red filter, a green filter, a blue filter, a cyan filter, a yellow filter, a magenta filter, a white filter, a black filter, or an IR cutoff filter. For example, the color filters R, G, and B may include a red filter R, a green filter G, and a blue filter B. The light-collecting element 212 may include a digital lens or a hemispherical lens.

The image sensor in accordance with the first embodiment includes phase difference detection pixels for capturing incident light at different phase difference detection pixels to detect a phase of a captured image for implementing auto-focusing and representing a three-dimensional representation of the captured image or scene. Some of the locations for the pixels 110 are selected for phase difference detection pixels. For example, in adjacent pixels 110 shown in FIG. 1, a first pixel PX1 at a location of a blue pixel is fabricated as a phase difference detection pixel. The phase difference detection pixel PX1 may be formed over a substrate 200 such that the phase difference detection pixel PX1 may include a photoelectric conversion element PD for optical sensing for the phase difference detection and may abut on a grid pattern 204. The first pixel PX1 may include a light-shield pattern 206 that overlaps the photoelectric conversion element. The light-shield pattern 206 is formed such that the first pixel PX1 have an open part 208 that allows incident light to enter the photoelectric conversion element PD for the optical sensing. Notably, the open part 208 is located away from the geometric center of the pixel PX1 or is eccentrically located within the pixel PX1. The eccentrically located open part 208 may deviate from a location of a symmetric axis in the photoelectric conversion element PD inside the pixel PX1 that is perpendicular to the plane of the photoelectric conversion element PD and passes through the geometric center of the phase difference detection pixel PX1, which may be referred to as the optical axis of the photoelectric conversion element PD. In some implementations, the open part 208 is formed on one side of the optical axis of the photoelectric conversion element PD. The remaining portion of the first pixel PX1 except the open part may be referred to as the non-open part. The first pixel PX1 includes the open part 208 and the non-open part where the light-shield pattern 206 is located. The space above the impurity region 202 and below the light-collecting element 212 in the phase difference detection pixel PX1 may be filled with different materials or structures depending on the specific structures of the device. For example, in a design where the phase difference detection pixel PX1 is placed at a location for a blue pixel in the Bayer pattern, this space may include a blue filter B, and the blue filter B may fill the open part 208 and cover the light-shield pattern 206. For another example, in a design where the phase difference detection pixel PX1 is placed at a location for a white pixel that does not normally have a color filter, the material used in the light-collecting element 212 in the phase difference detection pixel PX1 may fill the space above the impurity region 202 and below the light-collecting element 212. The light-shield pattern 206 may be formed in the same level as the grid pattern 204, and may abut on the grid pattern 204. The light-shield pattern 206 may be formed along with the grid pattern 204 in the process of forming the grid pattern 204, and may be made of or include the same material. For reference, hereinafter, a first direction D1 denotes a direction in which the open part 208 is eccentrically located from the geometric center of the phase difference detection pixel PX1, and a second direction D2 is a direction opposite to the first direction D1. Also, a third direction D3 and a fourth direction D4 opposite to the third direction D3 are perpendicular to the first direction D1 or the second direction D2. In this example shown in FIG. 1, the first direction D1, the second direction D2, the third direction D3, and the fourth direction D4 are shown as the right, left, upward, and downward directions, respectively.

FIG. 2 shows a second pixel PX2 that is adjacent to the phase difference detection pixel PX1 and operates as an imaging pixel for imaging. The imaging pixel PX2 is located adjacent to the phase difference detection pixel PX1 but is shifted in position in the first direction. Referring to FIG. 2, the open part 206 of the phase difference detection pixel PX1 and the imaging pixel PX2 are located on a same side of the light-shield pattern 206. The imaging pixel PX2 may be an imaging pixel at a green location in the Bayer pattern so that it includes a green filter G. When the imaging pixel is located adjacent to the phase difference detection pixel, the characteristics of imaging pixels may be degraded due to reception of unintended incident light at an adjacent imaging pixel from the phase difference detection pixel. Particularly, as the area in the imaging pixel which facing the light-receiving region of the phase difference detection pixel is larger in comparison with the light-receiving region of the adjacent phase difference detection pixel PX1 the characteristic degradation of the imaging pixel may be more severe due to optical crosstalk between the two adjacent pixels. In order to reduce or prevent this undesired optical crosstalk, the image sensor in accordance with the first embodiment may include a light blocking layer 220 formed between the photoelectric conversion elements PD of the phase difference detection pixel PX1 and the imaging pixel PX2. The light blocking layer 220 may include a light-shielding material that may include a light-reflecting or light-absorbing material. The position of the light blocking layer 220 may be decided in light of the light-receiving region of the first pixel PX1, for example, the shape and the position of the open part 208 of the phase difference detection pixel. In the implementation shown in FIGS. 1 and 2, the light blocking layer 220 is formed between the phase difference detection pixel PX1 and the imaging pixel PX2 when the imaging pixel PX2 is the imaging pixel that is located closest along the first direction D1 to the open part 208 of the light-shield pattern 206 in the phase difference detection pixel PX1. As discussed, the first direction D1 denotes the direction in which the open part 208 is eccentrically located from the geometric center of the phase difference detection pixel PX1 and thus, the imaging pixel which is the closest to the phase difference detection pixel PX1 along the first direction becomes most affected by optical crosstalk caused by the phase difference detection pixel PX1.

In order to effectively prevent optical crosstalk between the first pixel PX1 and the second pixel PX2, the light blocking layer 220 may be embedded in a trench 222 formed in the substrate 200. The trench 222 may be formed between the photoelectric conversion elements PDs of the phase difference detection pixel PX1 and the imaging pixel PX2. Referring to FIG. 2, the substrate 200 has a depressed top surface due to the trench 220 between the phase difference detection pixel PX1 and the adjacent imaging pixel PX2, while the substrate 200 has a non-depressed top surface between the remaining pixels. In some implementations, the sidewall of the trench 222 may abut on the sidewall of the photoelectric conversion elements of the phase difference detection pixel PX1 and the imaging pixel PX2. The bottom of the trench 222 may be located to be higher than the bottom of the photoelectric conversion element PD. Viewed from the substrate of the substrate 200 on which the light is received or the light is incident and thus operates as the light-receiving face or the light-incident face, the depth of the trench 222 may be less than the height of the photoelectric conversion element PD. This design can be used to minimize the characteristic degradation caused by the trench 222, when the trench 222 has defects on the surface of the trench 222. The entrance of the trench 222 may be formed in the surface of the substrate 200 corresponding to the light-receiving face or the light-incidence face. In some implementations, the light blocking layer 220 may abut on the surface of the substrate 200 corresponding to the light-receiving face or the light-incidence face. Accordingly, the light blocking layer 220 may abut on the grid pattern 204, or may be located so as to be close to the grid pattern 204. While the specification describes the trench for embedding the light blocking layer 220, any other structures can be implemented.

In the plan view, the light blocking layer 220 may have the bar shape having a major axis and a minor axis. The major axis of the light blocking layer 220 may extend from the space between the phase difference detection pixel PX1 and the adjacent imaging pixel PX2 in the third direction D3 and the fourth direction D4. The both ends of the light blocking layer 220 may be positioned between the pixels 110 that are adjacent to the phase difference detection pixel PX1 and the imaging pixel PX2 in the third direction D3 and the fourth direction D4. This design can be used to more effectively prevent optical crosstalk between the first pixel PX1 and the second pixel PX2.

In the plan view, the open part 208 of the light-shield pattern 206 may also have the bar shape having a major axis and a minor axis, and the major axis of the open part 208 may also extend in the third direction D3 and the fourth direction D4. Here, in order to more effectively prevent optical crosstalk between the phase difference detection pixel PX1 and the imaging pixel PX2, the length of the major axis of the light blocking layer 220 may be greater than that of the open part 208. As described above, the both ends of the light blocking layer 220 may be located between the pixels 110 that are adjacent to the phase difference detection pixel PX1 and the imaging pixel PX2 in the third direction D3 and the fourth direction D4. Accordingly, the both ends of the light blocking layer 220 may abut on portions of the sidewalls of the photoelectric conversion elements PDs of the pixels 110 that are adjacent to the phase difference detection pixel PX1 and the imaging pixel PX2 in the third direction D3 and the fourth direction D4.

As described above, the image sensor in accordance with the first embodiment provides the light blocking layer 220 so as to be embedded in the trench 222 between the photoelectric conversion elements PD of the phase difference detection pixel and the adjacent imaging pixels, and may thereby prevent characteristic degradation caused by optical crosstalk. Furthermore, the trench 222 for forming the light blocking layer 220 is formed in only a portion of the pixel array, for example, the region between the phase difference detection pixel and the adjacent imaging pixel. As shown in FIG. 2, the trench 222 is located between the phase difference detection pixel PX1 and the imaging pixel PX2 only and there is no trench located in other regions, for example, between the phase difference detection pixel PX1 and the adjacent pixel which is located opposite to the imaging pixel PX2, and between the imaging pixel PX2 and its adjacent pixel which is located opposite to the phase difference detection pixel PX1. Since the trench 222 is located in the limited portion only, for example, between the phase difference detection pixel and the adjacent imaging pixel, the characteristic degradation attributable to the trench 222 can be minimized or prevented.

Figure 3:
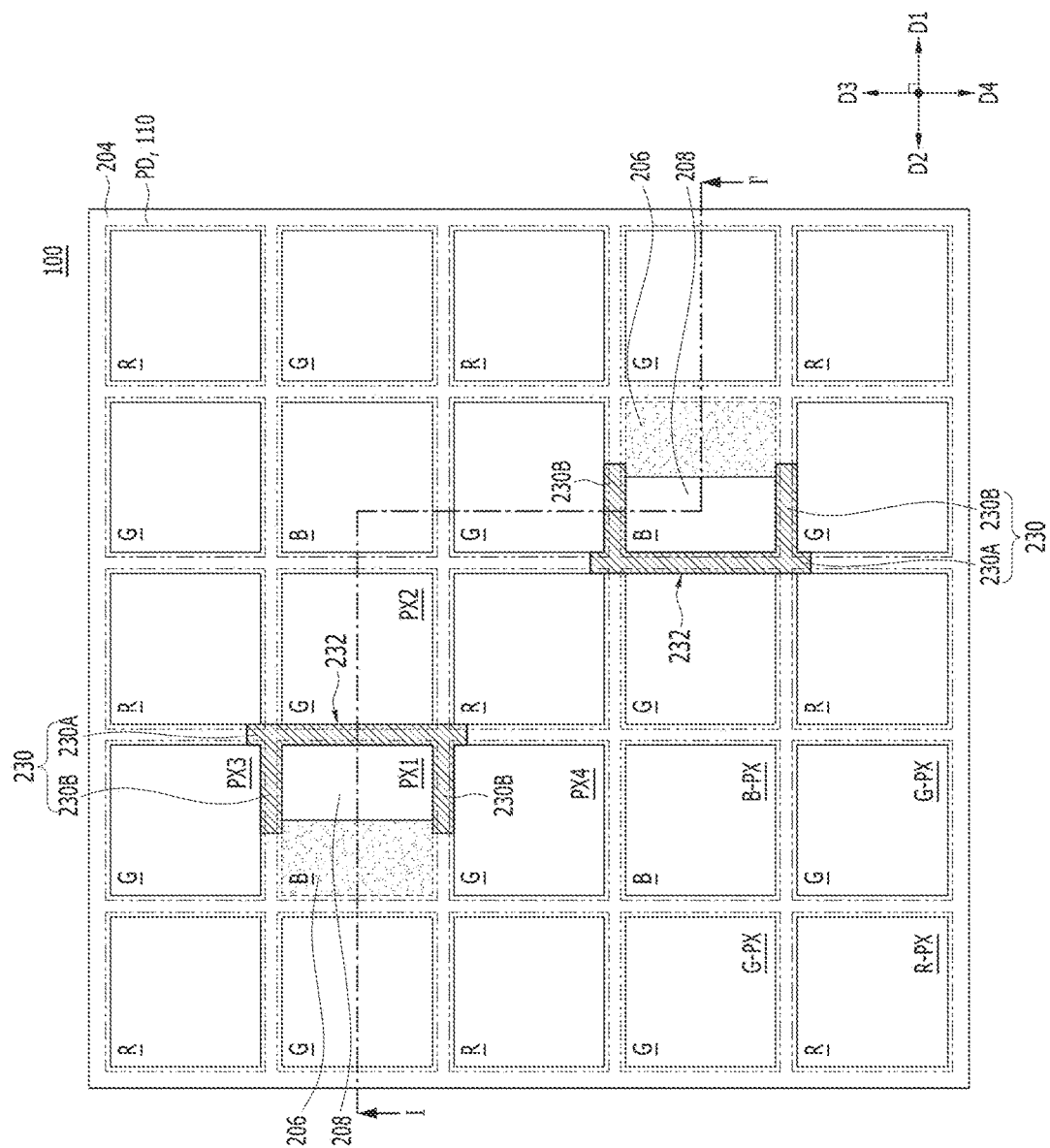
FIG. 3 and FIG. 4 are views illustrating an exemplary image sensor in accordance with a second embodiment of the present disclosure.
Figure 4:
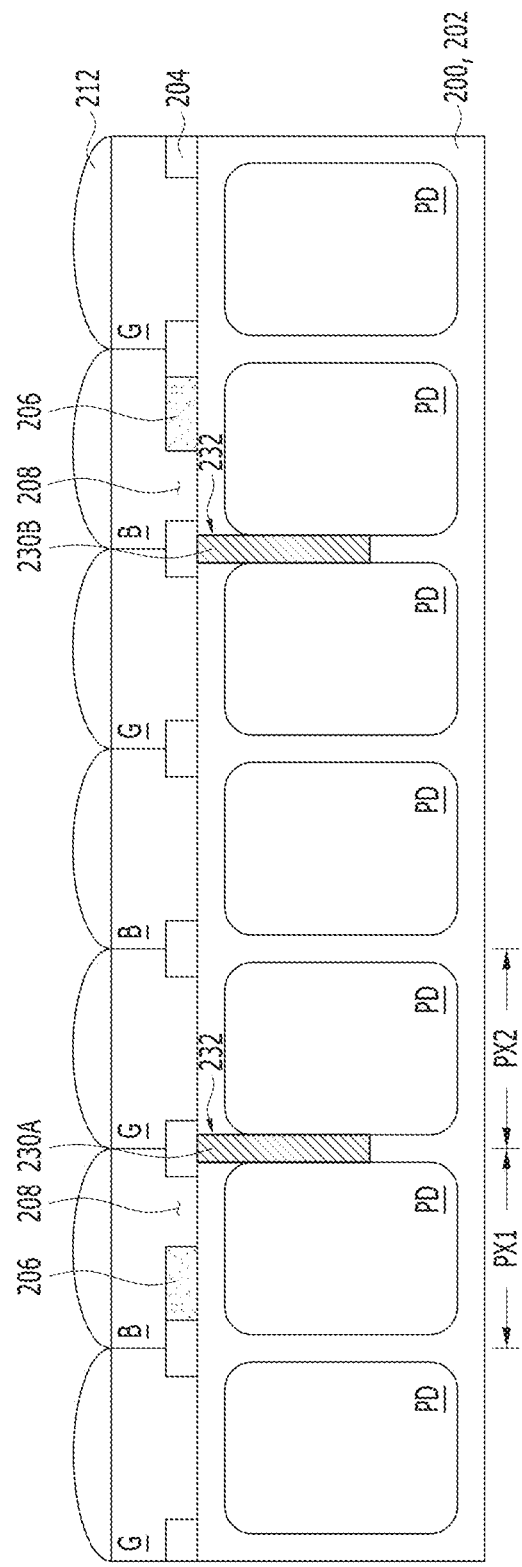

FIG. 3 and FIG. 4 are views illustrating an image sensor in accordance with a second embodiment of the present disclosure. FIGS. 3 and 4 show various configurations of the light blocking layer 220 which is formed to surround at least a portion of the photoelectric conversion element PD in the phase difference detection pixel PX1 and at least portions of the photoelectric conversion elements PDs in the imaging pixels PX2, PX3, PX4. Specifically, FIG. 3 is a plan view illustrating a part of a pixel array, and FIG. 4 is a cross-sectional view illustrating a cross section formed by cutting along the dotted line I-I' shown in FIG. 3. Hereinafter, for the convenience of description, a description will focus on a difference from the image sensor in accordance with the first embodiment. Also, the same reference numerals will be used to designate the same parts as in the first embodiment, and a detailed description of the same parts will be omitted.

As illustrated in FIG. 3 and FIG. 4, the image sensor in accordance with the second embodiment includes a first pixel PX1 operating as a phase difference detection pixel. Although the image sensor in FIGS. 3 and 4 shows the first pixel PX1 as the phase difference detection pixel, other implementations are possible. For example, one of other pixels 110 than the first pixel PX1 can be selected to operate as the phase difference detection pixel. The first pixel PX1 may include a light-shield pattern 206 that overlaps the photoelectric conversion element and has an open part 208. The open part 208 may deviate from a location of a symmetric axis in the photoelectric conversion element PD inside the first pixel that is perpendicular to the plane of the photoelectric conversion element PD and passes through the geometric center of the first pixel, which may be referred to as the optical axis of the photoelectric conversion element PD. For example, in a design where the first pixel PX1 is placed at a location for a blue pixel in the Bayer pattern, this space may include a blue filter B, and the blue filter B may fill the open part 208 and cover the light-shield pattern 206. For another example, in a design where the first pixel PX1 is placed at a location for a white pixel that does not normally have a color filter, the light-collecting element 212 in the first pixel PX1 may fill the space above the impurity region 202 and below the light-collecting element 212. The light-shield pattern 206 may be formed in the same level as the grid pattern 204, and may abut on the grid pattern 204. The light-shield pattern 206 may be formed along with the grid pattern 204 in the process of forming the grid pattern 204, and may be made of or include the same material as the grid pattern 204. As discussed with respect to the first implementation in FIGS. 1 and 2, a first direction D1 denotes a direction in which the open part 208 is eccentrically located from the geometric center of the first pixel PX1, and a second direction D2 is a direction opposite to the first direction D1. Also, a third direction D3 and a fourth direction D4 opposite to the third direction D3 are perpendicular to the first direction D1 or the second direction D2. In this example shown in FIG. 3, the first direction D1, the second direction D2, the third direction D3, and the fourth direction D4 are shown as right, left, upward, and downward directions, respectively.

FIG. 3 shows the second pixel PX2 that is adjacent to the first pixel PX1 in the first direction D1 and operates as an imaging pixel for imaging. FIG. 3 also shows a third pixel PX3 that is adjacent to the first pixel PX1 in the third direction D3 and operates as an imaging pixel and a fourth pixel PX4 that is adjacent to the first pixel PX1 in the fourth direction D4 and operates as an imaging pixel. Here, the characteristics of imaging pixels, for example, the second, third, and fourth pixels PX2, PX3, PX4, which are adjacent to the phase difference detection pixel PX1, may be degraded due to reception of unintended incident light flowing from the phase difference detection pixel. The characteristic degradation of the imaging pixel becomes more severe due to optical crosstalk as the area in the adjacent imaging pixel facing the light-receiving region of the phase difference detection pixel becomes larger. For example, as the portion of the imaging pixel which faces the open part 208 of the light-shield pattern 206 becomes larger, the characteristic degradation of the imaging pixel may be more severe due to optical crosstalk. In order to reduce or prevent this, the image sensor in accordance with the second embodiment may include a light blocking layer 230 that is formed between the photoelectric conversion elements PD of the first pixel PX1 and the second pixel PX2, between the photoelectric conversion element PDs of the first pixel PX1 and the third pixel PX3, and between the photoelectric conversion element PDs of the first pixel PX1 and the fourth pixel PX4. The exemplary implementation as shown in FIG. 3 shows that the light blocking layer 230 is formed in a portion of the region between the first pixel PX1 and the third pixel PX3 and in a portion of the region between the first pixel PX1 and the fourth pixel PX4. Thus, each of the portions of the light blocking layer 230 formed between the first pixel PX1 and the third pixel PX3 and between the first pixel PX1 and the fourth pixel PX4 has a smaller size than that of the portion of the light blocking layer 230 formed between the first pixel PX1 and the second pixel PX2. This is because that the third pixel PX3 and the fourth pixel PX4 may be less affected by optical crosstalk caused by the first pixel PX1, compared to the second pixel PX2, since each of the portions of third pixel PX3 and the fourth pixel PX4 facing the light-receiving region of the first pixel PX1 is smaller than that of the second pixel PX2.

In order to effectively reduce or prevent optical crosstalk between the first pixel PX1 and any one of the second to fourth pixels PX2 to PX4, the light blocking layer 230 may be embedded in a trench 232 formed in the substrate 200. The trench 232 may be formed between the photoelectric conversion element PD of the first pixel PX1 and any one of the photoelectric conversion elements PD of the second to fourth pixels PX2 to PX4. The sidewall of the trench 232 may abut on the sidewalls of the photoelectric conversion elements PD of the first to fourth pixels PX1 to PX4. The bottom of the trench 232 may be located to be higher than the bottom of the photoelectric conversion elements PD of the pixel 110. In other words, the depth of the trench 232 may be less than the height of the photoelectric conversion element PD. This design can be used to minimize the characteristic degradation caused by the trench 232 when the trench 232 has defects on the surface of the trench 232.

In the plan view, the light blocking layer 230 may include a first region 230A and a second region 230B, each of which has the bar shape having a major axis and a minor axis. The major axis of the first region 230A may extend from the space between the first pixel PX1 and the second pixel PX2 in the third direction D3 and the fourth direction D4. The both ends of the first region 230A along the third direction D3 and the fourth direction D4 may be extended to be located between the pixels 110 that are adjacent to the first pixel PX1 and the second pixel PX2 in the third direction D3 and the fourth direction D4. The major axis of the second region 230B may extend from the space between the first pixel PX1 and the third pixel PX3 or the fourth pixel PX4 along the first direction or the second direction D2.

In the plan view, the open part 208 of the light-shield pattern 206 may also have the bar shape having a major axis and a minor axis, and the major axis of the open part 208 may also extend in the third direction D3 and the fourth direction D4. Here, in order to more effectively prevent optical crosstalk, the length of the major axis of the first region 230A may be greater than that of the open part 208. In some implementations, the both ends of the first region 230A may be located between the pixels 110 that are adjacent to the first pixel PX1 and the second pixel PX2 in the third direction D3 and the fourth direction D4. Accordingly, the both ends of the first region 230A may abut on portions of the sidewalls of the photoelectric conversion elements PD of the pixels 110 that are adjacent to the first pixel PX1 and the second pixel PX2 in the third direction D3 and the fourth direction D4. Also, in order to more effectively reduce prevent optical crosstalk, the length of the major axis of the second region 230B may be greater than the length of the minor axis of the open part 208 as long as the major axis of the second region 230B remains within the first pixel PX1.

As described above, the image sensor in accordance with the second embodiment provides the light blocking layer 230 so as to be embedded in the trench 232 formed between the photoelectric conversion elements PD of the phase difference detection pixel and the imaging pixel, and may thereby prevent characteristic degradation caused by optical crosstalk. Furthermore, the trench 232 for the light blocking layer 230 is formed in only a portion of the region between the phase difference detection pixel and the imaging pixel, whereby characteristic degradation attributable to the trench 232 can be minimized or prevented.

Figure 5:
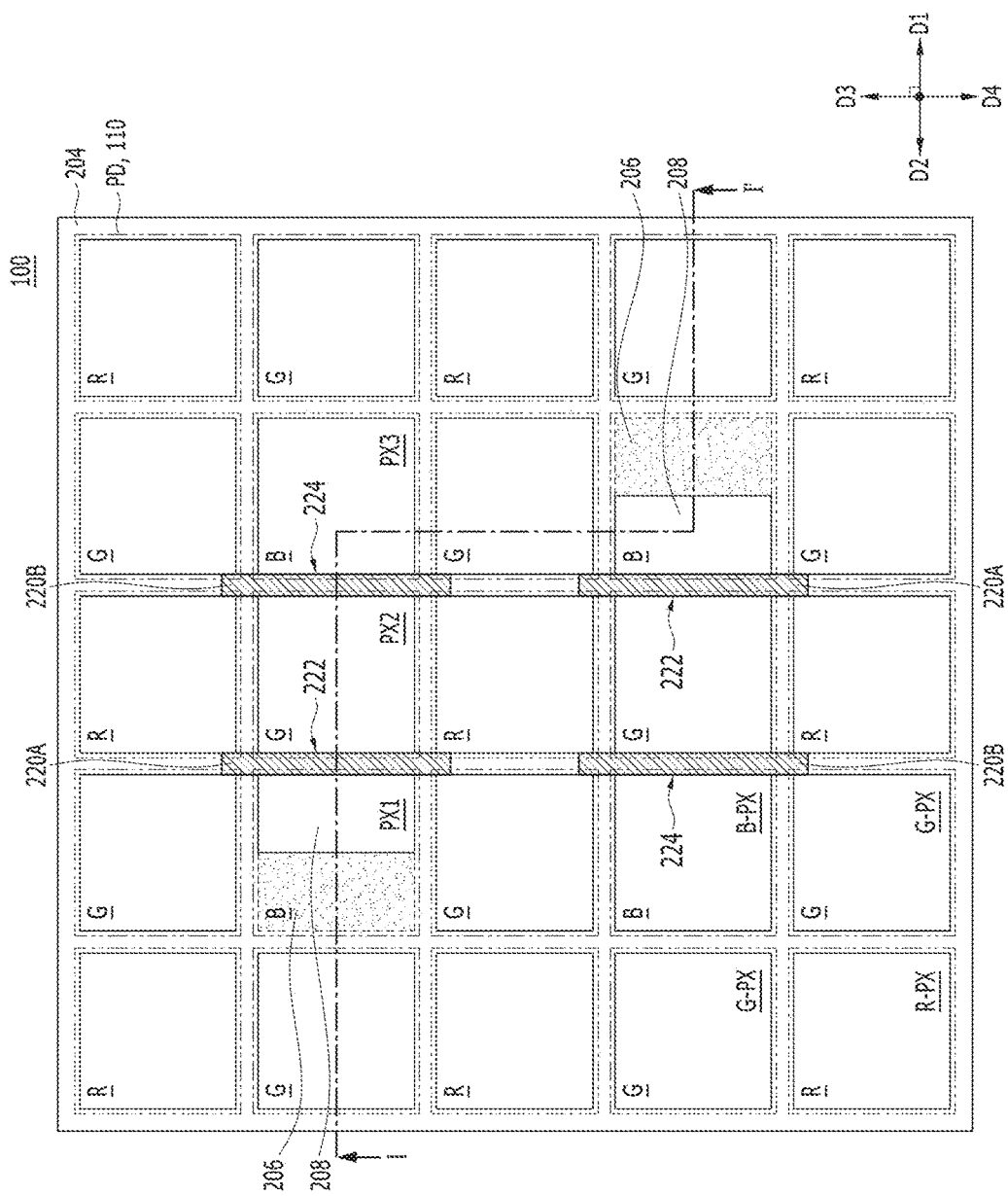
FIG. 5 and FIG. 6 are views illustrating an exemplary image sensor in accordance with a third embodiment of the present disclosure.
Figure 6:
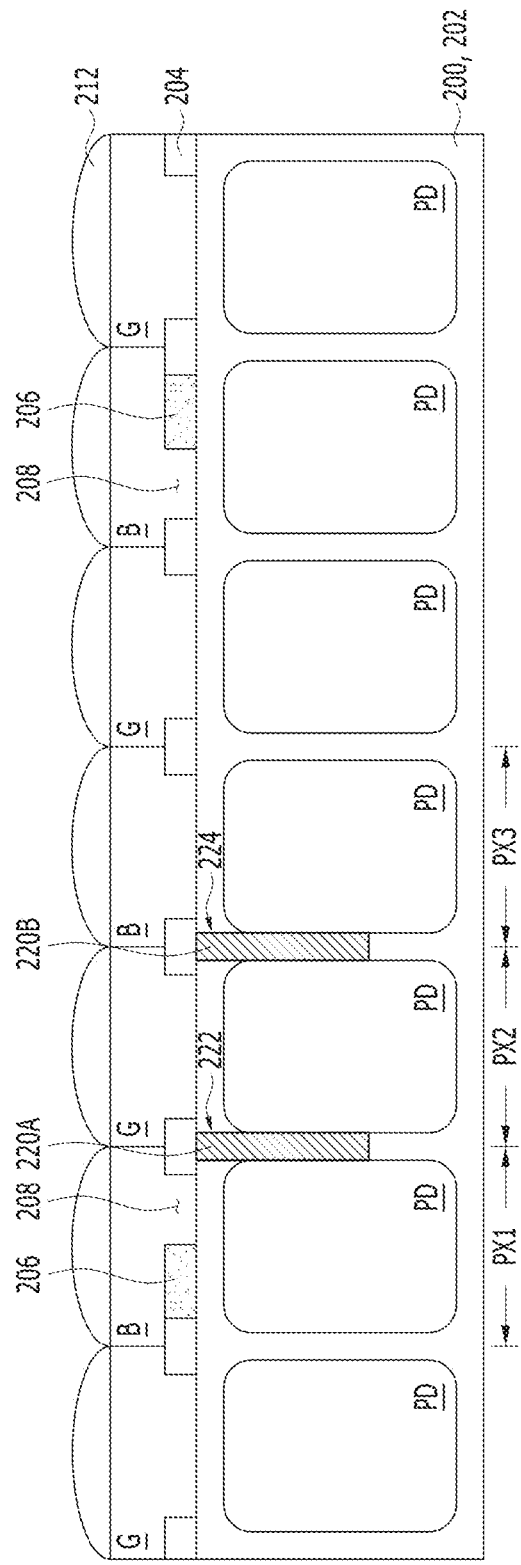

FIG. 5 and FIG. 6 are views illustrating an image sensor in accordance with a third embodiment of the present disclosure. FIGS. 5 and 6 show various configurations of the light blocking layer including a first light blocking layer 220A which is formed between the photoelectric conversion elements PDs in the first pixel PX1 and the imaging pixel PX2 and a second light blocking layer 220B which is formed between the photoelectric conversion elements PDs in the second pixel PX2 and the third pixel PX3. Specifically, FIG. 5 is a plan view illustrating a part of a pixel array, and FIG. 6 is a cross-sectional view illustrating a cross section cut along the dotted line I-I' shown in FIG. 5. Hereinafter, for the convenience of description, a description will focus on a difference from the image sensor in accordance with the first and second embodiments. Also, the same reference numerals will be used to designate the same parts as in the first and second embodiments, and a detailed description of the same parts will be omitted.

As illustrated in FIG. 5 and FIG. 6, the image sensor in accordance with the third embodiment includes a first pixel PX1 operating as a phase difference detection pixel. Although the image sensor in FIGS. 5 and 6 shows the first pixel PX1 as the phase difference detection pixel, other implementations are possible. For example, any one of the pixels 110 can be selected to operate as the phase difference detection pixel. The first pixel PX1 may include a light-shield pattern 206 that overlaps the photoelectric conversion element and has an eccentrically located open part 208. The open part 208 may deviate from the optical axis of the photoelectric conversion element PD in the first pixel PX1. In some implementations, the open part 208 is formed on a side of the optical axis of the photoelectric conversion element PD. The space above the impurity region 202 and below the light-collecting element 212 in the first pixel PX1 may be filled with different materials or structures depending on the specific structures of the device. For example, in a design where the phase difference detection pixel PX1 is placed at a location for a blue pixel in the Bayer pattern, this space may include a blue filter B and the blue filter B may fill the open part 208 and cover the light-shield pattern 206. For another example, in a design where the first pixel PX1 is placed at a location for a white pixel that does not normally have a color filter, the material used in the light-collecting element 212 in the first pixel PX1 may fill the space above the impurity region 202 and below the light-collecting element 212. The light-shield pattern 206 may be formed in the same level as the grid pattern 204, and may abut on the grid pattern 204. The light-shield pattern 206 may be formed along with the grid pattern 204 in the process of forming the grid pattern 204, and may be made of or include the same material as the grid pattern 204. As discussed with respect to the first and second implementations, a first direction D1 denotes a direction in which the open part 208 is eccentrically positioned from the geometric center of the first pixel PX1, and a second direction D2 is a direction opposite to the first direction D1. Also, a third direction D3 and a fourth direction D4 opposite to the third direction D3 are perpendicular to the first or second direction D1 or D2. In this example shown in FIG. 5, the first direction D1, the second direction D2, the third direction D3, and the fourth direction D4 are shown as the right, left, upward, and downward directions, respectively.

FIGS. 5 and 6 show a second pixel PX2 that is adjacent to the first pixel PX1 in the first direction D1 and operates as an imaging pixel for imaging. When the imaging pixel is located adjacent to the phase difference detection pixel, the characteristics of imaging pixels may be degraded due to reception of unintended incident light at an adjacent imaging pixel from the phase difference detection pixel. The characteristic degradation of the imaging pixel becomes more severe due to optical crosstalk between the two adjacent pixels, as the area in the imaging pixel facing the light-receiving region of the phase difference detection pixel becomes larger in comparison with the light-receiving region of the adjacent phase difference detection pixel PX1. In order to reduce or prevent this undesired optical crosstalk, the image sensor in accordance with the third embodiment may include a first light blocking layer 220A formed between the photoelectric conversion elements PDs of the first pixel PX1 and the second pixel PX2.

The image sensor of FIGS. 5 and 6 includes a third pixel PX3 that is adjacent to the second pixel PX2 in the first direction D1 and operates as an imaging pixel. The present implementation of the image sensor includes the second light blocking layer 220B that is formed between the photoelectric conversion elements PDs of the second pixel PX2 and the third pixel PX3. It is observed that the characteristics of the second pixel PX2 are degraded due to optical crosstalk not only between the phase difference detection pixel and the imaging pixel but also between the imaging pixels. The second light blocking layer 220B is formed to avoid or reduce the affect caused by the optical crosstalk between the imaging pixels. While the planar shape of the pixel array 100 is a rectangle having the long side extended in the first direction D1 and the second direction D2, the second pixel PX2 and the third pixel PX3 are adjacent to each other such that the second pixel PX2 is located adjacent to the third pixel PX3 in the second direction D2 and thus the second pixel PX2 may be most affected by optical crosstalk caused by the incident light in the second direction D2. For example, the unintended incident light is received at the second pixel PX2 from the third pixel PX3. In order to solve this problem, the image sensor in accordance with the third embodiment may include a second light blocking layer 220B that is formed between the photoelectric conversion element PDs of the second pixel PX2 and the third pixel PX3.

The first light blocking layer 220A and the second light blocking layer 220B may include light-shielding material that may include a light-reflecting or light-absorbing material. The positions at which the first light blocking layer 220A and the second light blocking layer 220B are formed depend on the light-receiving region of the first pixel PX1, for example, the shape and the position of the open part 208 of the light-shield pattern 206.

The first light blocking layer 220A and the second light blocking layer 220B may be embedded in the first trench 222 and the second trench 224 formed in the substrate 200, respectively, in order to effectively prevent optical crosstalk. The first trench 222 and the second trench 224 may have the same shape, and may be arranged in parallel. In some implementations, the first trench 222 and the second trench 224 may be formed on opposite sides of the photoelectric conversion element PD in the second pixel PX2. For example, the first trench 222 and the second trench 224 may be respectively located on one side and the other side of the photoelectric conversion element PD of the second pixel PX2. The first trench 222 may be formed between the photoelectric conversion elements PD of the first pixel PX1 and the second pixel PX2. The sidewall of the first trench 222 may abut on the sidewall of the photoelectric conversion elements PD of the first pixel PX1 and the second pixel PX2. The second trench 224 may be formed between the photoelectric conversion elements PD of the second pixel PX2 and the third pixel PX3. The sidewall of the second trench 224 may abut on the sidewall of the photoelectric conversion elements PD of the second pixel PX2 and the third pixel PX3. The bottoms of the first trench 222 and the second trench 224 may be located to be higher than the bottom of the photoelectric conversion element PD. That is, the depth of the first trench 222 and the second trench 224 may be less than the height of the photoelectric conversion element PD.

In the plan view, each of the first light blocking layer 220A and the second light blocking layer 220B may have the bar shape having a major axis and a minor axis. The long axes of the first light blocking layer 220A and the second light blocking layer 220B may extend in the third direction D3 and the fourth direction D4. The both ends of the first light blocking layer 220A along the third and fourth directions D3 and D4 may be positioned between the pixels 110 that are adjacent to the first pixel PX1 and the second pixel PX2 in the third direction D3 and the fourth direction D4. This design can be used to more effectively prevent optical crosstalk between the first pixel PX1 and the second pixel PX2. Also, the both ends of the second light blocking layer 220B may be positioned between the pixels 110 that are adjacent to the second pixel PX2 and the third pixel PX3 in the third direction D3 and the fourth direction D4. This design can be used to more effectively prevent optical crosstalk between the second pixel PX2 and the third pixel PX3.

In the plan view, the open part 208 of the light-shield pattern 206 may also have the bar shape having a major axis and a minor axis, and the major axis of the open part 208 may also extend in the third direction D3 and the fourth direction D4. Here, in order to more effectively prevent optical crosstalk, the length of the major axis of the first light blocking layer 220A and the length of the second light blocking layer 220B may be greater than the length of the major axis of the open part 208. In some implementations, the both ends of each of the first light blocking layer 220A and the second light blocking layer 220B may be located between the pixels 110 that are adjacent to the first to third pixels PX1 to PX3 in the third direction D3 and the fourth direction D4. Accordingly, the both ends of the first light blocking layer 220A may abut on a portion of the sidewall of the photoelectric conversion elements PD of the pixels 110 that are adjacent to the first pixel PX1 and the second pixel PX2 in the third direction D3 and the fourth direction D4. Also, the both ends of the second light blocking layer 220B may abut on a portion of the sidewall of the photoelectric conversion elements PD of the pixels 110 that are adjacent to the second pixel PX2 and the third pixel PX3 in the third direction D3 and the fourth direction D4. The length of the major axis of the first light blocking layer 220A may be equal to that of the second light blocking layer 220B. Accordingly, the first light blocking layer 220A and the second light blocking layer 220B may have the same shape.

As described above, the image sensor in accordance with the third embodiment provides the first light blocking layer 220A between the photoelectric conversion elements PD of the phase difference detection pixel and the imaging pixel, and may thereby prevent characteristic degradation caused by optical crosstalk. Furthermore, the second light blocking layer 220B is formed between the photoelectric conversion elements PD of the imaging pixels in consideration of the light-receiving region of the phase difference detection pixel, whereby characteristic degradation caused by optical crosstalk may be more effectively prevented.

Figure 7:
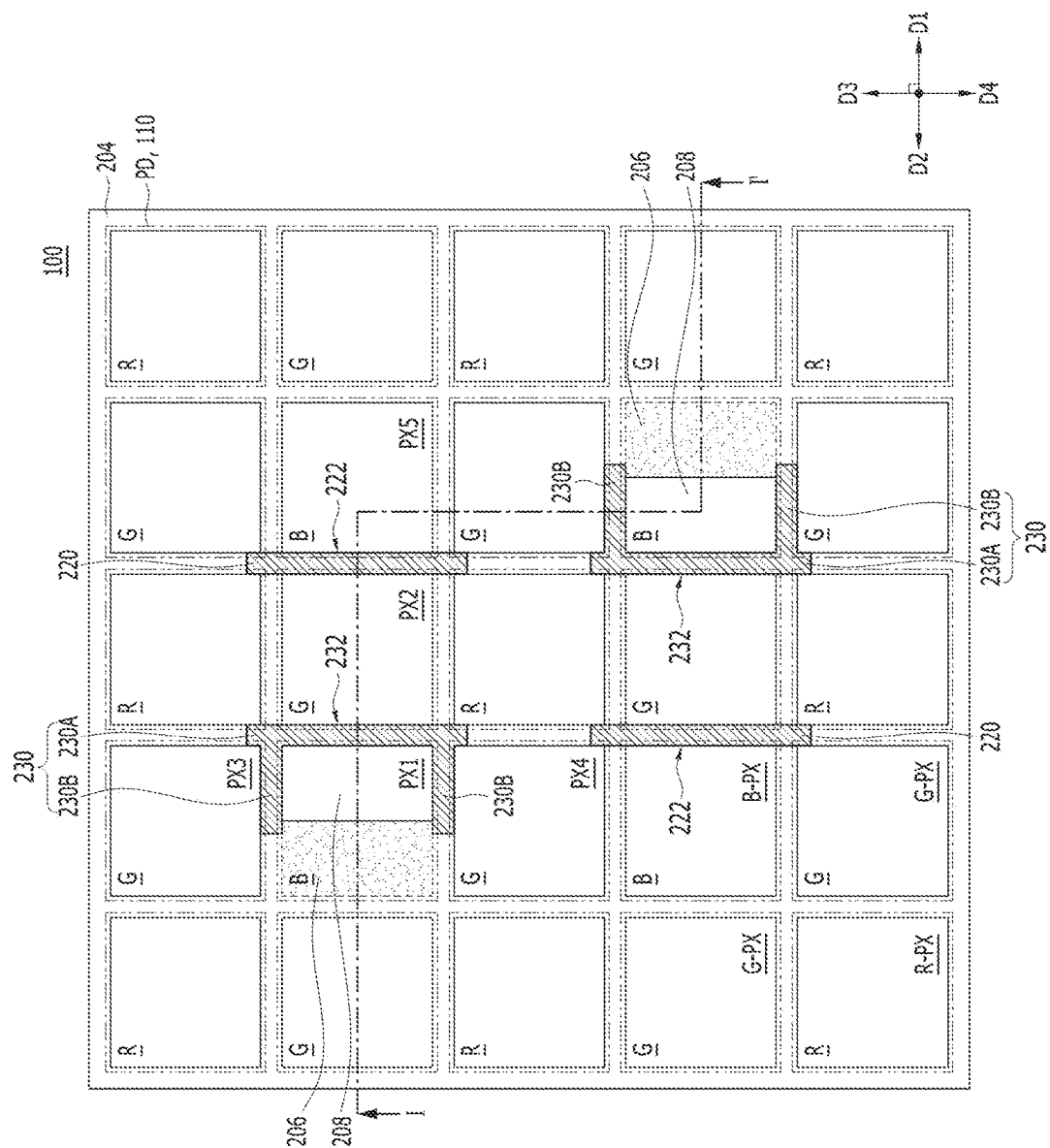
FIG. 7 and FIG. 8 are views illustrating an exemplary image sensor in accordance with a fourth embodiment of the present disclosure.
Figure 8:
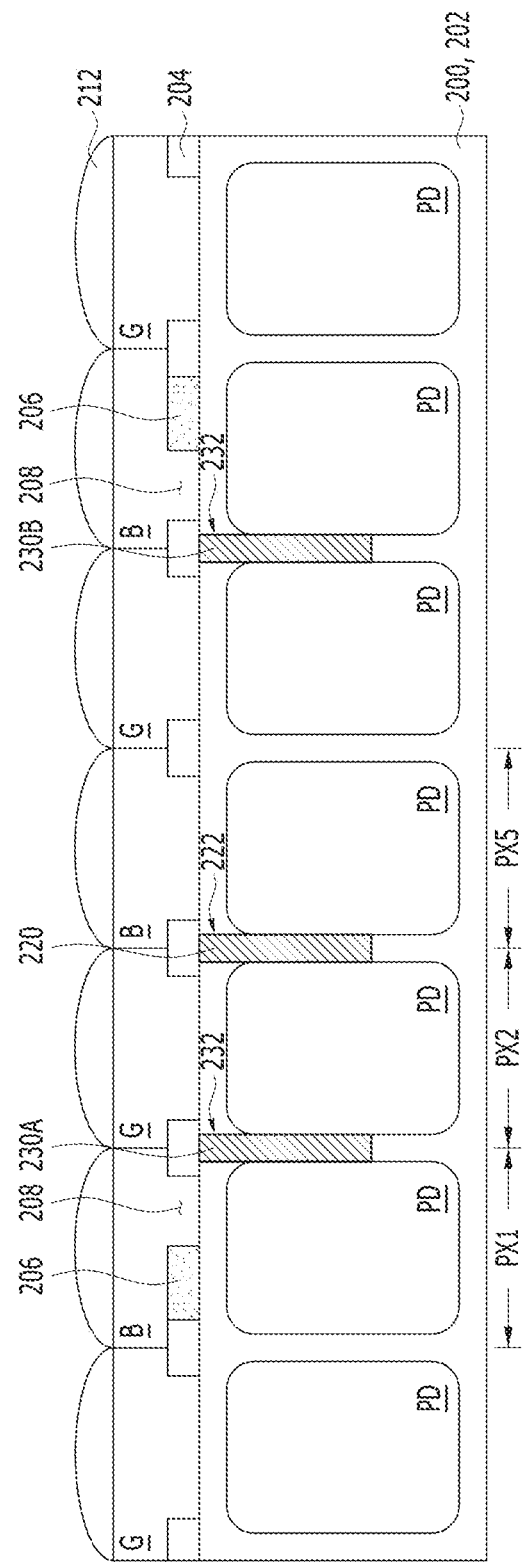

FIG. 7 and FIG. 8 are views illustrating an image sensor in accordance with a fourth embodiment of the present disclosure. FIGS. 7 and 8 show various configurations of the light blocking layer including the first light blocking layer 230 which is formed to surround at least a portion of the photoelectric conversion element PD in the first pixel PX1 and at least portions of the photoelectric conversion elements PDs in the imaging pixels PX2, PX3, PX4 and the second light blocking layer 220 which is formed between the photoelectric conversion elements PDs in the second pixel PX2 and the fifth pixel PX5. Specifically, FIG. 7 is a plan view illustrating a part of a pixel array, and FIG. 8 is a cross-sectional view illustrating a cross section cut along the dotted line I-I' shown in FIG. 7. Hereinafter, the third embodiment will be explained with the descriptions focused on the difference from that of the first to third embodiments. Also, the same reference numerals will be used to designate the same parts as in the first to third embodiments, and a detailed description of the same parts will be omitted.

As illustrated in FIG. 7 and FIG. 8, the image sensor in accordance with the fourth embodiment includes a first pixel PX1 operating as a phase difference detection pixel. The first pixel PX1 may include a light-shield pattern 206 that overlaps the photoelectric conversion element and has an open part 208. The open part 208 may deviate from a location of a symmetric axis in the photoelectric conversion element PD inside the first pixel PX1 that is perpendicular to the plane of the photoelectric conversion element PD and passes through the geometric center of the first pixel, which may be referred to as the optical axis of the photoelectric conversion element PD. In some implementations, the open part 208 is formed on a side of the optical axis of the photoelectric conversion element PD. The first pixel PX1 may include a blue filter B and the blue filter B may fill the open part 208 and cover the light-shield pattern 206. For another example, when the first pixel PX1 is placed at a location for a white pixel that does not normally have a color filter, the light-collecting element 212 in the first pixel PX1 may fill the space above the impurity region 202 and below the light-collecting element 212. The light-shield pattern 206 may be formed in the same level as the grid pattern 204, and may abut on the grid pattern 204. The light-shield pattern 206 may be formed along with the grid pattern 204 in the process of forming the grid pattern 204, and may be made of or include the same material as the grid pattern 204. A first direction D1 denotes a direction in which the open part 208 is eccentrically located from the geometric center of the first pixel PX1, and a second direction D2 is a direction opposite to the direction D1. Also, a third direction D3 and a fourth direction D4 opposite to the third direction D3 are perpendicular to the first direction D1 or the second direction D2. In this example, the first direction D1, the second direction D2, the third direction D3, and the fourth direction D4 are shown as the right, left, upward, and downward directions, respectively.

The second pixel PX2 that is adjacent to the first pixel PX1 in the first direction D1 may operate as an imaging pixel. Also, the third pixel PX3 that is adjacent to the first pixel PX1 in the third direction D3 and the fourth pixel PX4 that is adjacent to the first pixel PX1 in the fourth direction D4 may also operate as imaging pixels. Here, the characteristics of imaging pixels adjacent to the phase difference detection pixel may be degraded due to reception of unintended incident light flowing from the phase difference detection pixel. Particularly, as the area in the imaging pixel facing the light-receiving region of the phase difference detection pixel becomes larger, the characteristic degradation of the imaging pixels may be more severe due to optical crosstalk. For example, as the portion of the imaging pixel facing the open part 208 of the light-shield pattern 206 becomes larger, the optical crosstalk cause more characteristic degradation of the imaging pixel. In order to reduce or prevent this, the image sensor in accordance with the fourth embodiment may include a first light blocking layer 230 that is formed between the photoelectric conversion elements PD of the first pixel PX1 and the second pixel PX2, formed in a portion of the region between the photoelectric conversion elements PD of the first pixel PX1 and the third pixel PX3, and formed in a portion of the region between the photoelectric conversion elements PD of the first pixel PX1 and the fourth pixel PX4. As already explained with respect to FIGS. 3 and 4, each of the portions 230B of the light blocking layer 230 formed between the first pixel PX1 and the third pixel PX3 and between the first pixel PX1 and the fourth pixel PX4 has a smaller size than that of the portion 230A of the light blocking layer 230 formed between the first pixel PX1 and the second pixel PX2.

A fifth pixel PX5 that is adjacent to the second pixel PX2 in the first direction D1 may operate as an imaging pixel. Here, the characteristics of the second pixel PX2 may be degraded due to optical crosstalk between imaging pixels. Because the planar shape of the pixel array 100 is a rectangle having the long axis extended in the first direction D1 and the second direction D2, the second pixel PX2 that is adjacent to the first pixel PX1 in the first direction D1 may be most affected by optical crosstalk caused by incident light in the second direction D2. The reception of unintended incident light at the second pixel PX2 from the fifth pixel PX5 may cause the optical crosstalk. In order to solve this problem, the image sensor in accordance with the fourth embodiment may include a second light blocking layer 220 formed between the photoelectric conversion elements PD of the second pixel PX2 and the fifth pixel PX5.

The first light blocking layer 230 and the second light blocking layer 220 may include light-shielding material that may include a light-reflecting or light-absorbing material. The positions at which the first light blocking layer 230 and the second light blocking layer 220 depends on the light-receiving region of the first pixel PX1, for example, the shape and the position of the open part 208 of the light-shield pattern 206.

The first light blocking layer 230 and the second light blocking layer 220 may be embedded in the first trench 232 and the second trench 222 formed in the substrate 200, respectively, in order to effectively prevent optical crosstalk. The first trench 232 and the second trench 222 may have different shapes, and may be arranged in parallel with each other across the second pixel PX2. In some implementations, the first trench 222 and the second trench 224 may be formed on opposite sides of the photoelectric conversion element PD in the second pixel PX2. For example, the first trench 232 and the second trench 222 may be respectively located on one side and the other side of the photoelectric conversion element PD of the second pixel PX2. The first trench 232 may be formed between the photoelectric conversion element PD of the first pixel PX1 and the photoelectric conversion element PD of the second to fourth pixels PX2 to PX4. The sidewall of the first trench 232 may abut on the sidewalls of the photoelectric conversion elements PD of the first to fourth pixels PX1 to PX4. The second trench 222 may be formed between the photoelectric conversion elements PD of the second pixel PX2 and the fifth pixel PX5. The sidewall of the second trench 222 may be abut on the sidewall of the photoelectric conversion elements PD of the second pixel PX2 and the fifth pixel PX5. The bottoms of the first trench 232 and the second trench 222 may be higher than the bottom of the photoelectric conversion element PD. In other words, the depth of the first trench 232 and the second trench 222 may be less than the height of the photoelectric conversion element PD. This is intended to minimize characteristic degradation attributable to the first trench 232 and/or the second trench when the first trench 232 and/or the second trench has the defects on their surfaces.

In the plan view, the first light blocking layer 230 may include a first region 230A and a second region 230B, each of which has the bar shape having a major axis and a minor axis. The major axis of the first region 230A may be aligned in the third direction D3 and the fourth direction D4. The both ends of the first region 230A may be located between the pixels 110 that are adjacent to the first pixel PX1 and the second pixel PX2 in the third direction D3 and the fourth direction D4. This design may help to more effectively prevent optical crosstalk between the first pixel PX1 and the second pixel PX2. The major axis of the second region 230B may extend from the first region 230A in the second direction D2.

In the plan view, the open part 208 of the light-shield pattern 206 may also have the bar shape having a major axis and a minor axis, and the major axis of the open part 208 may also extend in the third direction D3 and the fourth direction D4. Here, in order to more effectively prevent optical crosstalk, the length of the major axis of the first region 230A may be greater than that of the open part 208. In some implementations, the both ends of the first region 230A may be located between the pixels 110 that are adjacent to the first pixel PX1 and the second pixel PX2 in the third direction D3 and the fourth direction D4. Accordingly, the both ends of the first region 230A may abut on a portion of the sidewall of the photoelectric conversion elements PD of the pixels 110 that are adjacent to the first pixel PX1 and the second pixel PX2 in the third direction D3 and the fourth direction D4. Also, in order to more effectively prevent optical crosstalk, the length of the major axis of the second region 230B may be greater than the length of the minor axis of the open part 208 as long as the major axis of the second region 230B remains within the first pixel PX1.

In the plan view, the second light blocking layer 220 may have the bar shape having a major axis and a minor axis. The major axis of the second light blocking layer 220 may extend in the third direction D3 and the fourth direction D4. Here, in order to more effectively prevent optical crosstalk, the length of the major axis of the second light blocking layer 220 may be greater than that of the open part 208. In this case, the both ends of the second light blocking layer 220 may be located between the pixels 110 that are adjacent to the second pixel PX2 and the fifth pixel PX5 in the third direction D3 and the fourth direction D4. Accordingly, the both ends of the second light blocking layer 220 may abut on portions of the sidewalls of the photoelectric conversion elements PD of the pixels 110 that are adjacent to the second pixel PX2 and the fifth pixel PX5 in the third direction D3 and the fourth direction D4. Accordingly, the second light blocking layer 220 may have a shape that differs from the shape of the first light blocking layer 230.

As described above, the image sensor in accordance with the fourth embodiment forms the first light blocking layer 230 between the photoelectric conversion elements PD of the phase difference detection pixel and the imaging pixel, and may thereby prevent characteristic degradation caused by optical crosstalk. Furthermore, the second light blocking layer 220 is formed between the photoelectric conversion elements PD of the imaging pixels in consideration of the light-receiving region of the phase difference detection pixel, whereby characteristic degradation caused by optical crosstalk may be more effectively prevented.

Figure 9:
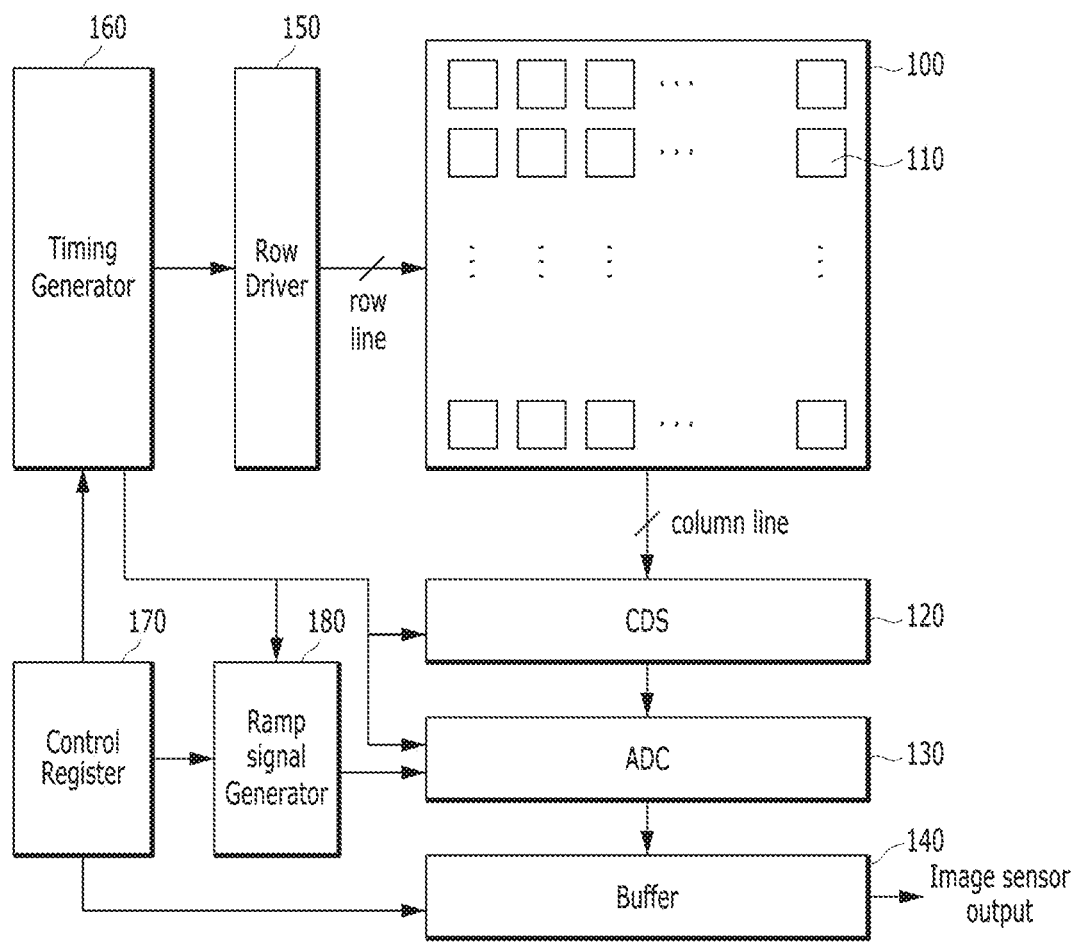
FIG. 9 is a block diagram schematically illustrating a representation of an example of an image sensor based on an embodiment of the present disclosure.

FIG. 9 is a block diagram schematically illustrating a representation of an example of an image sensor based on an embodiment of the present disclosure.

As shown in FIG. 9, the image sensor may include a pixel array 100, a correlated double sampling (CDS) 120, an analog-digital converter (ADC) 130, a buffer 140, a row driver 150, a timing generator 160, a control register 170, and a ramp signal generator 180. The plurality of pixels 110 may be arranged in a matrix structure.

The timing generator 160 generates one or more control signals for controlling the respective operations of the row driver 150, the correlated double sampling (CDS) 120, the analog-digital converter (ADC) 130 and the ramp signal generator 180. The control register 170 generates one or more control signals for controlling the respective operations of the ramp signal generator 180, the timing generator 160 and the buffer 140.

The row driver 150 is coupled to the pixel array 100 through a row line. The row driver 150 drives the pixel array 100 with the row line. For example, the row driver 150 may generate a select signal for selecting a particular row line among a plurality of row lines. The plurality of row lines are coupled with the plurality of pixels 110, respectively. One row line is coupled to each of the plurality of pixels 110.

The correlated double sampling 120 is coupled to the pixel array 150 through column lines. Each of the plurality of pixels 110 senses incident light, and outputs an image reset signal and an image signal to the correlated double sampling 120 through a column line. The correlated double sampling 120 performs sampling for each of the image reset signal and the image signal that are received from the pixel array 100. The plurality of pixels 110 are coupled to a plurality of column lines, respectively. One column line is coupled to each of the plurality of pixels 110. The analog-digital converter 130 is coupled with the correlated double sampling 120 and the ramp signal generator 180. The analog-digital converter 130 is configured to receive a sampling signal and a ramp signal from the correlated double sampling 120 and the ramp signal generator 180, respectively, compare the ramp signal which is outputted from the ramp signal generator 180 with the sampling signal which is outputted from the correlated double sampling 120, and output a comparison signal. In some implementations, the analog-digital converter 130 is coupled to the timing generator 160 which provides a clock signal to the analog-digital converter 130. The analog-digital converter 130 counts a level transition time of the comparison signal using the clock signal which is provided from the timing generator 160, and outputs a count value to the buffer 140. In some implementations, the timing generator is further coupled to the ram signal generator 180 and the ramp signal generator 180 may operate under control of the timing generator 160.

The buffer 140 is coupled to the analog-digital converter 130 to receive digital signals from the analog-digital converter 130. In some implementations, the buffer 140 may include a memory (not shown) and a sense amplifier (not shown). The buffer 140 stores digital signals which are outputted from the analog-digital converter 130. In some implementations, the memory of the buffer 140 stores the count values that are counted by and provided from the analog-digital converter 130. The count values may be associated with the signals outputted from the plurality of pixels 110. The buffer 140 is further configured to sense and amplify the stored digital signals, and outputs the amplified resultant signals. The sense amplifier of the buffer 140 is structured to sense and amplify the respective count values which are outputted from the memory.

The image sensor in accordance with the above-described embodiments can be used in various electronic devices or systems. Hereafter, a case in which the image sensor in accordance with the embodiments is applied to a camera will be described with reference to FIG. 10.

Figure 10:
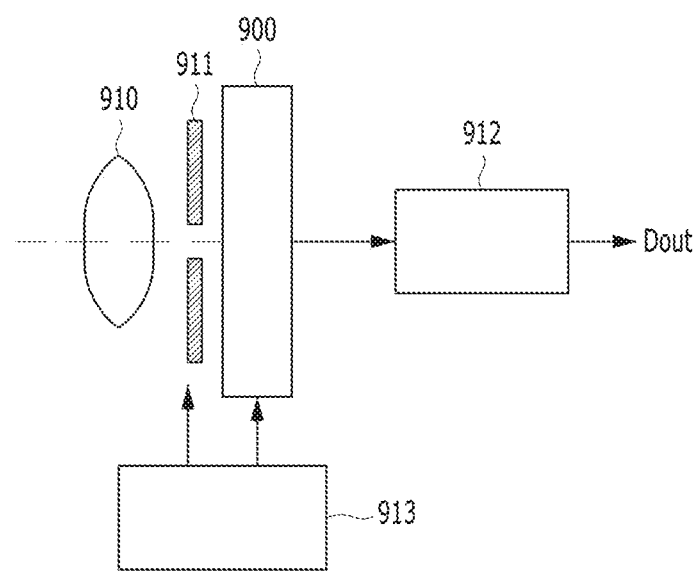
FIG. 10 is a diagram schematically illustrating a representation of an example of an electronic device including an image sensor based on an embodiment of the present disclosure.

FIG. 10 is a diagram schematically illustrating a representation of an example of an electronic device including the image sensor based on an embodiment of the disclosed technology.

Referring to FIG. 10, the electronic device including the image sensor based on the embodiment of the disclosed technology may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 guides image light (incident light) from an object, to a pixel array (see the reference numeral 100 of FIG. 1, FIG. 3, FIG. 5, FIG. 7 and FIG. 9) of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or the like.

The present disclosure based on the above-described solution forms a light blocking layer so as to embedded in a trench between a photoelectric conversion element of a phase difference detection pixel (a first pixel) and a photoelectric conversion element of an imaging pixel (a second pixel), whereby characteristic degradation caused by optical crosstalk may be prevented. Also, the trench for the light blocking layer is formed in only a portion of the region between the phase difference detection pixel and the imaging pixel, whereby characteristic degradation attributable to the trench may be prevented.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An image sensor, comprising:
a substrate including a plurality of pixels including a first pixel and a second pixel that are located adjacent to each other in a first direction, the first pixel including a first photoelectric conversion element and an open part which is eccentrically located in the first pixel in the first direction and the second pixel including a second photoelectric conversion element;
a light-shield pattern that is formed over a part of the first photoelectric conversion element of the first pixel; and
a light blocking layer formed between the first photoelectric conversion element and the second photoelectric conversion element, and
the image sensor further comprises:
a grid pattern formed over the substrate along boundaries of the plurality of pixels,
wherein the light-shield pattern is formed in a same level as the grid pattern and abuts on the grid pattern.

2. The image sensor of claim 1, wherein the light blocking layer abuts on a surface of the substrate over which the grid pattern is formed.

3. The image sensor of claim 1, wherein the light blocking layer is formed in a trench formed in the substrate.

4. The image sensor of claim 1, wherein the light blocking layer extends along third and fourth directions that cross the first direction and opposite to each other and has ends located between pixels adjacent to the first pixel and the second pixel.

5. The image sensor of claim 1, wherein the light blocking layer has a bar shape having a major axis extending in a third direction crossing the first direction, and a minor axis.

6. The image sensor of claim 5,
wherein the open part has a bar shape having a major axis and a minor axis,
wherein the major axis of the open part extends in the third direction, and
wherein a length of the major axis of the light blocking layer is greater than a length of the major axis of the open part.

7. The image sensor of claim 1,
wherein the light blocking layer includes a first region and a second region, each of the first region and the second region has a bar shape having a major axis and a minor axis,
wherein the major axis of the first region extends in a third direction crossing the first direction, and
wherein the major axis of the second region extends in a second direction opposite to the first direction.

8. The image sensor of claim 7,
wherein the open part has a bar shape having a major axis and a minor axis, and the major axis of the open part extends in the third direction, and wherein a length of the major axis of the first region is greater than a length of the major axis of the open part, and a length of the major axis of the second region is greater than a length of the minor axis of the open part.

9. The image sensor of claim 1, wherein the light blocking layer extends along third and fourth directions that cross the first direction and opposite to each other and has ends located between pixels adjacent to the first pixel and the second pixel.

10. The image sensor of claim 1, wherein the first and second photoelectric conversion elements are electrically isolated from each other by an impurity region formed in the substrate.

11. The image sensor of claim 1, wherein the light blocking layer has a bar shape having a major axis extending in a third direction crossing the first direction, and a minor axis.

12. The image sensor of claim 11,
wherein the open part has a bar shape having a major axis and a minor axis,
wherein the major axis of the open part extends in the third direction, and
wherein a length of the major axis of the light blocking layer is greater than a length of the major axis of the open part.

13. The image sensor of claim 1,
wherein the light blocking layer includes a first region and a second region, each of the first region and the second region has a bar shape having a major axis and a minor axis,
wherein the major axis of the first region extends in a third direction crossing the first direction, and
wherein the major axis of the second region extends in a second direction opposite to the first direction.

14. The image sensor of claim 13,
wherein the open part has a bar shape having a major axis and a minor axis, and the major axis of the open part extends in the third direction, and
wherein a length of the major axis of the first region is greater than a length of the major axis of the open part, and a length of the major axis of the second region is greater than a length of the minor axis of the open part.

* * * * *